United States Patent [19]
Smith

[11] Patent Number: 5,625,471
[45] Date of Patent: Apr. 29, 1997

[54] DUAL PLATE HOLOGRAPHIC IMAGING TECHNIQUE AND MASKS

[75] Inventor: Adlai H. Smith, San Diego, Calif.

[73] Assignee: Litel Instruments, San Diego, Calif.

[21] Appl. No.: 333,555

[22] Filed: Nov. 2, 1994

[51] Int. Cl.$^6$ .............................. G03H 1/00; G03H 1/08; G02B 5/32; G21K 5/00

[52] U.S. Cl. .................... 359/30; 359/15; 359/9; 359/900; 378/34

[58] Field of Search .............................. 359/10, 11, 12, 359/16, 15, 30, 32, 900; 378/34, 35; 430/1

[56] References Cited

U.S. PATENT DOCUMENTS

| | | | |
|---|---|---|---|
| 3,630,593 | 12/1971 | Bartelt | 359/30 |
| 3,652,144 | 3/1972 | Lugt | 359/30 |
| 3,664,721 | 5/1972 | Roberts | 359/30 |
| 4,095,875 | 6/1978 | Lee et al. | 359/565 |
| 4,945,551 | 7/1990 | Makabe et al. | 378/34 |

*Primary Examiner*—Paul M. Dzierzynski
*Assistant Examiner*—Audrey Chang
*Attorney, Agent, or Firm*—Townsend and Townsend and Crew LLP

[57] ABSTRACT

In a system of proximity printing utilizing coherent light, a technique of phase only image correction is disclosed. Specifically, a holographic corrector plate is utilized. The image on the holographic corrector plate is produced by constructing a holographic image from the broadcast image and the intended working image. The broadcast image and the intended working image are placed in precise proximity printing alignment. With the respective images aligned, a coherent light beam is split to provide two temporally and spatially coherent beams. One of the temporally and spatially coherent beams scans the broadcast image. The other temporally and spatially coherent beam scans a mask containing the intended working image in a corresponding scan. A plane of beam intersection is chosen, with precise correspondence between rays at any point on the broadcast mask to rays from corresponding points on the working image mask. A hologram is produced at the plane of beam intersection with simultaneous and interfering scans at the plane of beam intersection. This hologram is then placed in a conventional proximity projection systems at the point of hologram production from broadcast mask to workpiece. The hologram has the effect of correcting the proximity image of the broadcast mask for the effects of diffraction and other optical artifacts, resulting in a corrected working image at the workpiece. Hologram production both on an analog basis and by synthetic means, such as a computer generated hologram basis is disclosed.

22 Claims, 6 Drawing Sheets

DUAL PLATE HOLOGRAPHIC IMAGING TECHNIQUE AND MASKS

This invention relates to proximity photolithographic imaging and ablative patterning. More specifically, a holographic plate is generated utilizing phase only interference patterns from both the broadcast image and the intended working image. The produced holographic plate, when inserted to a light path from the broadcast image to the workpiece, corrects for diffraction effects and other optical artifacts normally present in conventional image proximity projection and ablation.

BACKGROUND OF THE INVENTION

Photo-lithographic and ablative patterning of two dimensional structures are used in the manufacture of printed circuit boards, multi-chip modules, flat panels, chips, and the like. On a generalized basis, a mask contains an image to be broadcast. This will hereafter be referred to as the broadcast image. Typically, this broadcast image is projected to a workpiece. At the workpiece, the broadcast image produces a result. This result can be an image on photoresist which is later processed. Alternately, and in the case of ablative image processing, the image on the workpiece can be directly produced in the form of ablative patterning. It will be understood that in what follows, the examples of this disclosure are applicable to both types of systems.

Contact printing of workpieces is known. In this case, the broadcast image is in direct contact with the workpiece. The image is directly transferred from image to workpiece with little initial degradation.

Unfortunately, contact between mask and workpiece rapidly degrades the quality of the broadcast image from the mask if numerous prints must be made. This being the case, proximity imaging is utilized.

In proximity printing, a gap is maintained between the mask and the workpiece. This leads to a loss of resolution due to diffraction effects and other optical artifacts.

In Henry I. Smith et al. "Lithography Mask with A Pi-Phase Shifting Attenuator", U. S. Pat. No 4,890,309, issued Dec. 26, 1989, a technique for ameliorating this effects with pi ($\pi$) phase shifts on the mask with the broadcast image is shown. Unfortunately, utilizing this technique, diffraction due to the gap between the mask having the image to be broadcast and the workpiece still dominates image sharpness.

Projection printing is well known. Specifically, a projection lens system is utilized. The image to be projected is place at one conjugate of the projection image lens system. The surface onto which the image is to be projected (workpiece) is placed at the corresponding conjugate. Generally, projection printing is satisfactory; it produces good resolution, and the gap between the optic producing the projection and the workpiece is reasonable. However, it is well known that projection systems are expensive. With increasing field, lens system expense correspondingly increases.

SUMMARY OF THE INVENTION

In a system of proximity printing utilizing coherent light, a technique of phase only image correction is disclosed. Specifically, a holographic corrector plate is utilized. The image on the holographic corrector plate is produced by constructing a holographic image from the broadcast image and the intended working image. The broadcast image and the intended working image are placed in precise proximity printing alignment. With the respective images aligned, a coherent light beam is split to provide two temporally and spatially coherent beams. One of the temporally and spatially coherent beams scans the broadcast image. The other temporally and spatially coherent beam scans the a mask containing the intended working image in a corresponding scan. A plane of beam intersection is chosen, with precise correspondence between rays at any point on the broadcast mask to rays from corresponding points on the working image mask. A hologram is produced at the plane of beam intersection with simultaneous and interfering scans at the plane of beam intersection. This hologram is then placed in a conventional proximity projection systems at the point of hologram production from broadcast mask to workpiece. The hologram has the effect of correcting the proximity image of the broadcast mask for the effects of diffraction and other optical artifacts resulting in a corrected working image at the workpiece. Hologram production, both on an analog basis and by synthetic means, such as a computer generated hologram basis, is disclosed.

DESCRIPTION OF THE PREFERRED EMBODIMENT

Figure 1:
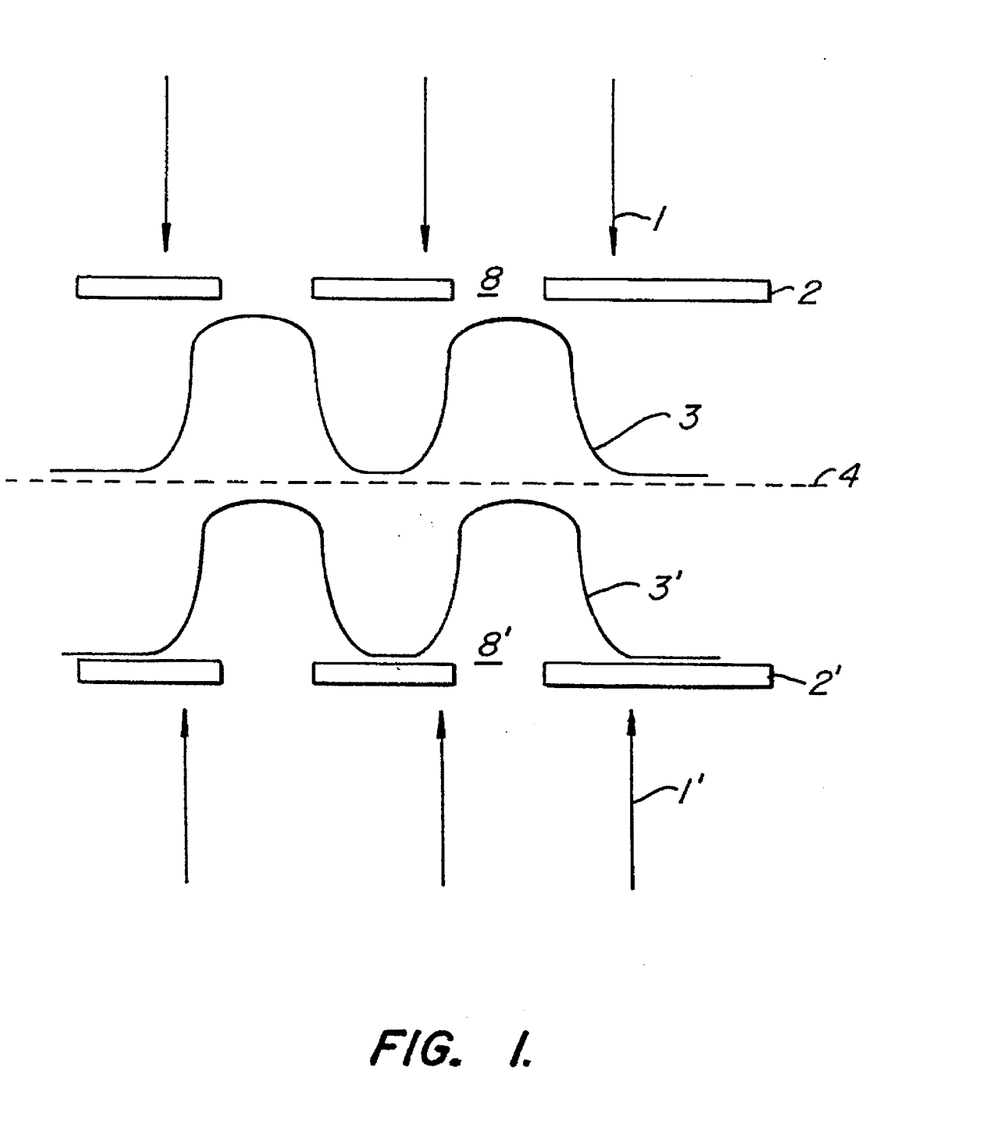
FIG. 1 is a diagram which can be utilized to explain the theory behind this invention, and the production of a simple hologram for the correction of image information in proximity image projection.

Referring to FIG. 1, both the theory and the method of production of a holographic corrector plate in accordance with this invention can be understood.

Regarding the theory of operation, broadcast mask 2 is illustrated being interrogated by first temporally and spatially coherent beam 1. Likewise, desired working image mask 2' is shown being interrogated by second temporally and spatially coherent beam 1'. Some comment can be made about the respective masks 2, 2' and the respective beams 1, 1'.

First, there is a direct one-to-one relationship between broadcast mask 2 and desired working image mask 2'. Specifically, desired working image mask 2' is in the precise format of that image which would be placed on a workpiece. Unfortunately, and but for the holographic corrector plate of this invention, projection of an image such as desired working image mask 2' could never occur. Specifically, at least diffraction effects would cause any image in the place of desired working image mask 2' to be imperfect if that image was produced only by first temporally and spatially coherent beam 1.

Second, first temporally and spatially coherent beam 1 and second temporally and spatially coherent beam 1' are beams conventionally produced for holography by well known and understood processes. Specifically, a single coherent light source is used. This coherent light source is beam split and diverted along separate interrogating paths to produce first temporally and spatially coherent beam 1 and second temporally and spatially coherent beam 1'. Any equivalent system can be utilized for producing beams 1, 1'.

Taking the case of each beam 1, 1' independently, when projected through their respective masks 2, 2' they will produce first intensity profile 3 and second intensity profile 3'.

Stopping here, it will be understood that by definition, the amplitudes of the respective first intensity profile 3 and second intensity profile 3' will be the same. The profiles will differ only in phase difference, which phase difference is here produced by diffractive effects and other artifacts.

Now we produce common plane 4. Common plane 4 is here selected to be equidistant and parallel to the parallel planes of broadcast mask 2 and desired working image mask 2'. Two effects will be present.

First, amplitudes in first intensity profile 3 and second intensity profile 3' will coincide. Second, there will remain only phase difference between the respective first intensity profile 3 and second intensity profile 3' as they interfere at common plane 4.

In the practice of this invention, a holographic image is recorded at common plane 4. This holographic image is phase only; no amplitude modulation is required in the optical arrangement of FIG. 1. The results of this can be understood with respect to FIG. 2.

Figure 2:
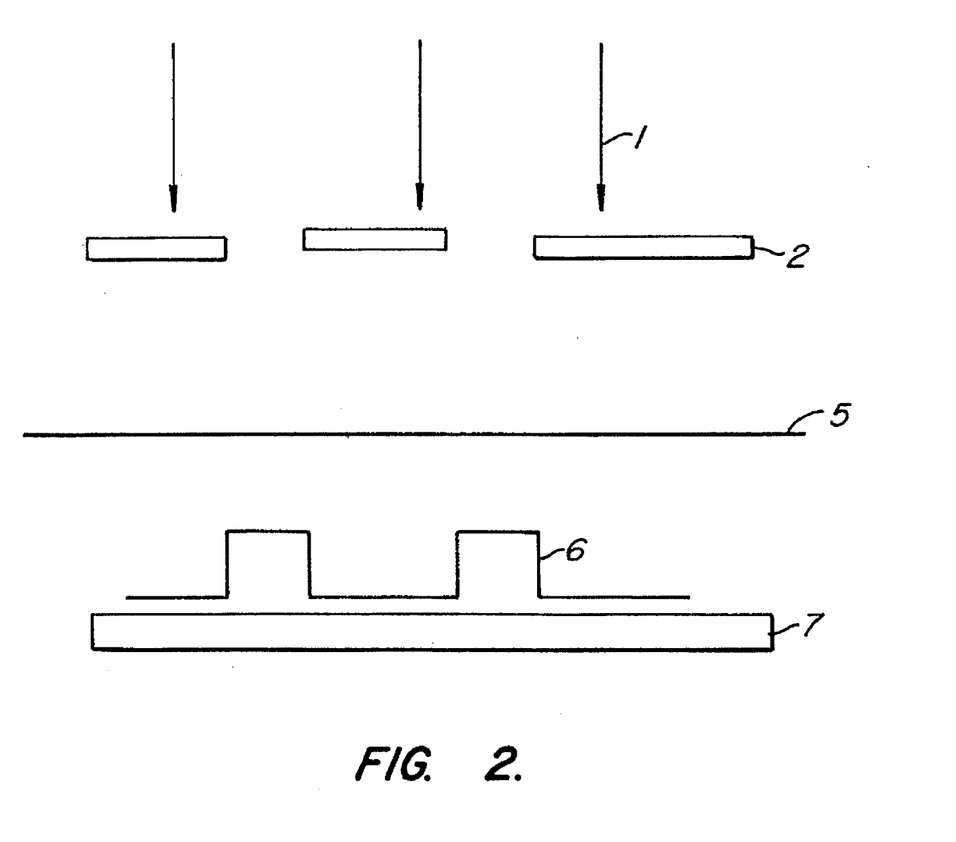
FIG. 2 illustrates proximity image projection utilizing a holographic projector plate to produce the compensated projection image of this invention.

Referring to FIG. 2, temporally and spatially coherent beam 1 is incident on broadcast mask 2. This light then is incident upon holographic plate 5. Holographic plate 5 contains an interference generated phase only correction image for those optical defects—here primarily diffraction defects—which have been generated through broadcast mask 2. This produces working image 6 on workpiece 7.

It is important to note that only phase correction is applied at holographic plate 5; amplitude correction is not utilized. This being the case, there is virtually no light loss due to necessary amplitude modulation in the correction scheme of this invention.

Regarding the types of images that can be utilized, either an ablative image or alternatively a photographic image at workpiece 7 can be produced. It will be noted that holographic plate 5 is placed in the same plane as common plane 4 with respect to broadcast mask 2. Further, workpiece 7 resides in precisely the same plane as desired working image mask 2' had in FIG. 1. A sharp proximity projected image with correction results.

It will be understood that holographic plate 5 can both be mathematically described and computer generated. The following equations are offered as an explanation that can easily be converted into such computer generation.

For digital production of holographic plate 5, the phase is calculated as follows.

W(y)=transmission amplitude of plate 2, =1 over openings, 0 otherwise

E(x)=complex electric field at plate 5 after propagating from mask 2 to holographic plate 5;

$$E(x) = A(x) \ast e^{i\phi(x)} = \int \frac{d^2y}{i\lambda z} e^{i\frac{k}{2z}(x-y)^2} W(y) \quad (1)$$

where:

x is a two dimensional vector position on holographic plate 5;

K is $2\pi/\lambda$ ($\lambda$ being defined as wave length);

A is the real amplitude (square root of the intensity ); and,

Z is the distance between the plane of the holographic image and the mask.

The phase applied to the plate 5 is just:

$$\phi_p(x) = -2 \ast \phi(x) \quad (2)$$

where:

$\phi$ is the phase at the plate; and, $\phi_p$ is the phase at the plate of the plus one (+1) order.

It is to be understood that the technique of this invention is not limited to first temporally and spatially coherent beam 1 and second temporally and spatially coherent beam 1' being collimated. The lack of this limitation is illustrated in FIGS. 3A and 3B.

Figure 3A:
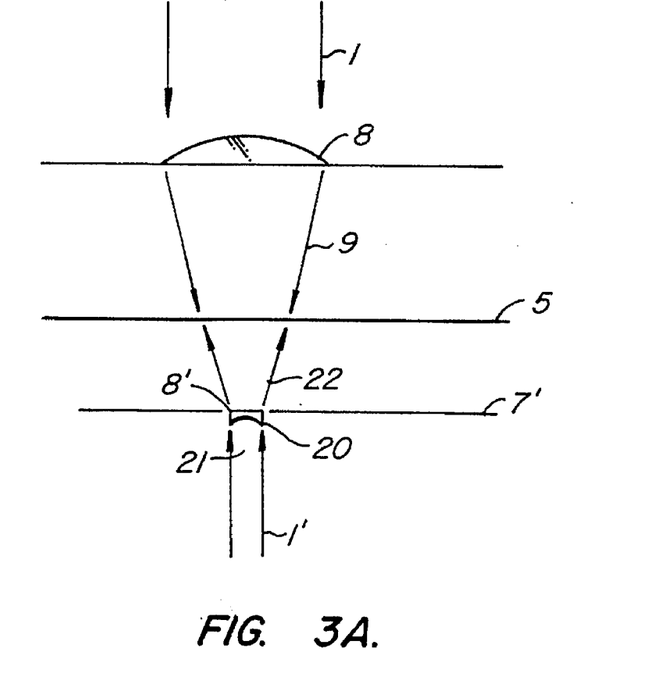
FIGS. 3A and 3B are respective proximity projection paths with FIG. 3A being a proximity projection path for the creation of a holographic plate and FIG. 3B illustrates the corrector plate in use within the proximity image projection path.
Figure 3B:
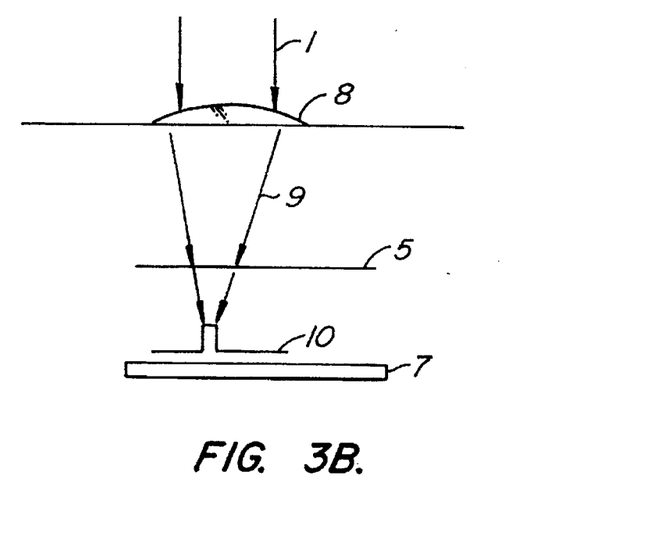

Referring first to FIG. 3B, it is desired to have a broadcast mask 8 containing square aperture 10 project through holographic plate 5 with correction to image defects. It will be noted that rays 9 converge to form square aperture 10 on workpiece 7. Having set forth the configuration desired, generation of holographic plate 5 can now be understood.

Referring to FIG. 3A, first temporally and spatially coherent beam 1 passes through broadcast mask 8 and then to recordation of holographic plate 5. The other required exposure for holographic plate 5 includes second temporally and spatially coherent beam 1' being routed through negative lens 20 where apparent image source 21 is generated with respect to workpiece plane 7'. It is thus seen that light diverges to holographic plate 5 from an intended image mask 8' while light converges from broadcast mask 8 to holographic plate 5. When holographic plate 5 is recorded, square aperture 10 can be produced without diffractive effects by the proximity projection effect set forth.

Actual plates have been fabricated utilizing this technique.

Figure 4:
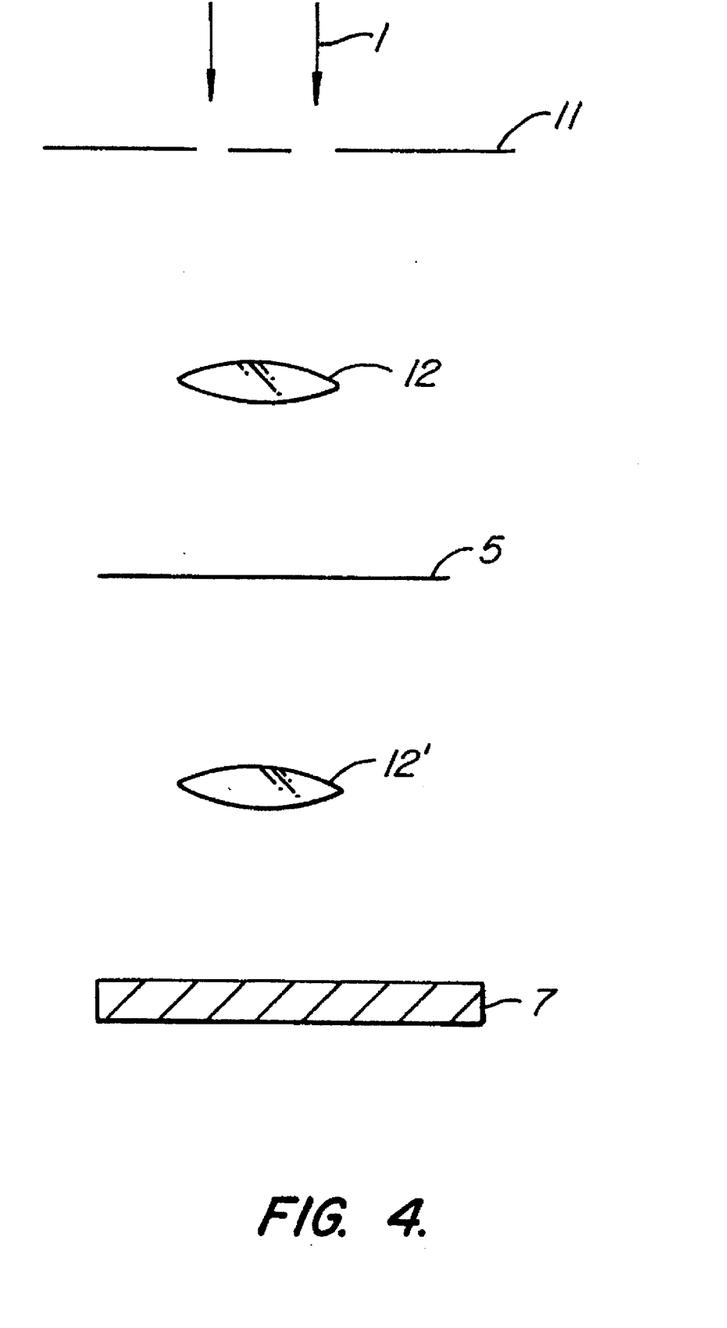
FIG. 4 illustrates the actual use of a corrector plate according to this invention within a simple symmetrical lens relay system for the amelioration of projection deficiencies of the lens system utilized.

It is to be understood that this invention is also applicable to the correction of simple, symmetrical lens systems. Referring to FIG. 4, mask 11 is illustrated with first temporally and spatially coherent beam 1 being incident upon mask 11 for projection of an image to workpiece 7. Two simple relay lenses including first relay lens 12 and second relay lens 12' are illustrated. These lenses function together to relay a less than perfect image of mask 11 to workpiece 7.

Holographic plate 5 generated by the same process of FIG. 1 is produced. That is to say, a desired working image mask having the same configuration of mask 11 is utilized. First temporally and spatially coherent beam and second temporally and spatially coherent beam produce holographic plate 5 which is recorded and then placed within the illustrated proximity projection system of FIG. 4. A corrected image results—even to the couplet (first relay lens 12, second relay lens 12') here illustrated.

Figure 5:
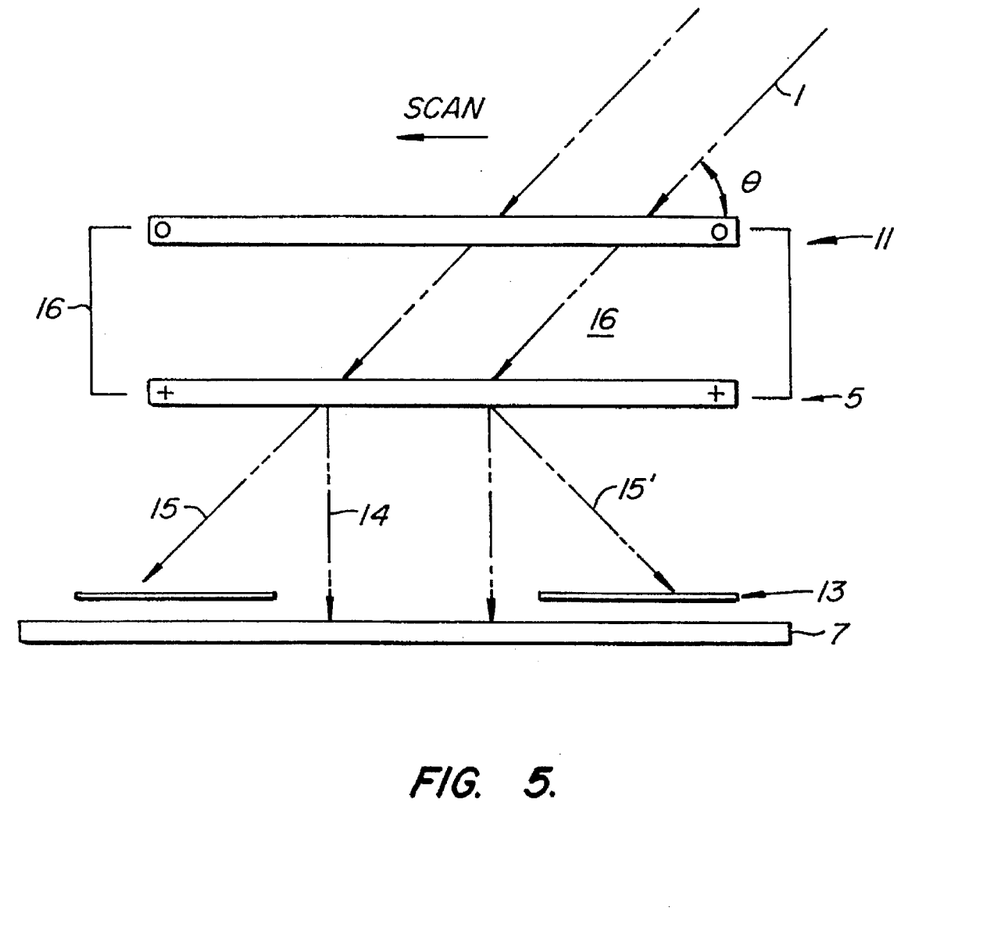
FIG. 5 illustrates a two plate broadcast image and corrector image plate system for telecentric proximity image projection at a workpiece, the particular configuration here lending itself to the computer generation of the holographic corrector plate; and, FIG. 6 is a broadcast plate and corrector plate proximity imaging system in which the produced image is non-telecentric.

Referring to FIG. 5, applicability of this invention to another type of proximity imaging system is disclosed. In this system, first temporally and spatially coherent beam 1 scans mask 11 with scanning beam 1 being at angle $\Theta$ with respect to the plane of mask 11. Angle $\Theta$ is chosen so that first order diffraction beam 14 can be deflected at holographic plate 5. Incidence of first order diffraction beam 14 on workpiece 7 is chosen to be collimated and normal to workpiece 7.

It is important that mask 11 and holographic plate 5 be fastened in a unitary relationship. Accordingly, optical frame 16 is schematically shown.

Additionally, since holographic plate 5 diffracts the effective first order, catcher plate 13 is utilized. Catcher plate 13 blocks all noise which can come from holographic plate 5 including zero order noise 15 and second order noise 15'. Diffraction of additional orders is not significant, and therefore not illustrated.

With the arrangement of FIG. 5, it will immediately be seen that generation of holographic plate 5 can occur by two techniques. First, analog generation similar to that illustrated with respect to FIG. 1 can occur. Specifically, by having second temporally and spatially coherent beam 1' scan a recording holographic plate 5 opposite to first order diffraction beam 14 simultaneously with first temporally and spatially coherent beam 1, a hologram will be produced that will attain the correction required for this invention.

Secondly, it will be realized by those having skill in the computer generation of holographic images, the optical path of FIG. 5 readily lends itself to the generation of holographic plate 5 by computer program. Specifically, and utilizing well understood programs, first temporally and spatially coherent beam 1 can be adjusted for phase at holographic plate 5. Likewise, second temporally and spatially coherent beam following the reverse of first order diffraction beam 14 can be mathematically generated. Computer generation of holographic plate 5 can readily be achieved utilizing at least some of the following equations:

In FIG. 5 the phase on plate 5 is calculated as above only now a carrier frequency is added to it. So the phase applied to the +1 order is;

$$\phi_p(x) = -2*\phi(x) + 2*\pi*x1/GP \quad (3)$$

where $\phi$ is the phase from equation (1);

$\phi_p$ is the phase in the plus one (+1) order;

x is a two dimensional vector giving plate position; and,

GP is the grating period.

Care must be taken that the grating period (GP) of the carrier frequency is high enough so that orders other than light diffracted into the non +1 orders is spatially separated from it upon reaching workpiece 7.

It should be noted that angularity is present between first temporally and spatially coherent beam 1 and first order diffraction beam 14. This angularity includes bending of first order diffraction beam 14 by angle Θ. This being the case, it can be understood that straight projection is not required for the practice of this invention.

It may be necessary to expand a beam to process a large area relative to information contained on mask 11. A configuration that reaches that result is illustrated in FIG. 6.

Figure 6:
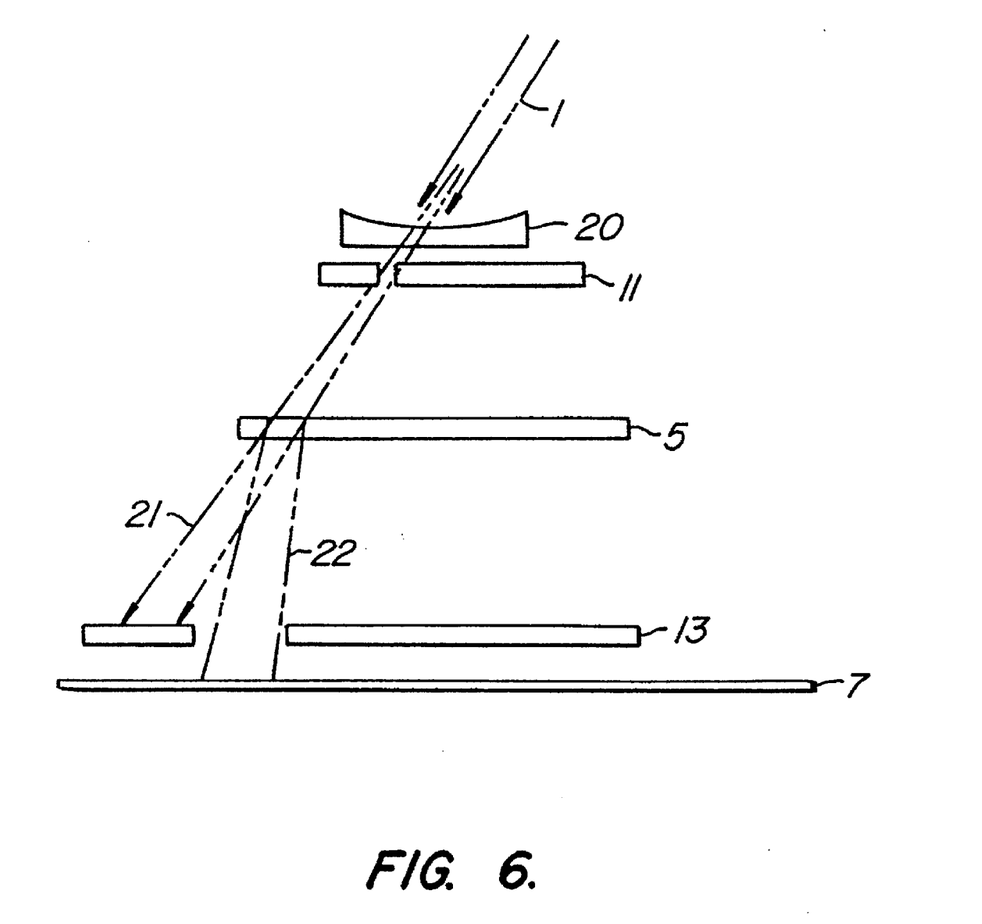

Referring to FIG. 6, mask 11 is shown scanned by first temporally and spatially coherent beam 1 through negative lens 20. This produces an expanding beam illustrated in zero order diverging beam 21. As before in FIG. 5, holographic plate 5 of FIG. 6 diverts first order diffraction beam 22 through catcher plate 13 to produce a required image on workpiece 7. As before, other orders of diffraction (including the second order) are not illustrated for simplicity of description. Further, and similar to FIG. 5, the embodiment of FIG. 6 readily lends itself to the computer generation of holographic images.

In such a computer generation, in FIG. 6, z1 = OPL (optical path length) between mask 11 and phase surface on holographic plate 5 z2 = OPL between phase surface on 5 and workpiece surface 7.

For the correction on holographic plate 5 to require only phase and no amplitude modulation of the incident wave z1 and z2 are related by:

$$z1 = M*z2 \quad (4)$$

where:

M = factor by which the image of mask 11 is expanded in size.

In particular, for the case of FIG. 2 where M=1, we have:

$$z1 = z2 \quad (5)$$

a result we have already stated. The derivation of equation 4 is strictly valid only in the paraxial domain, but is substantially true at larger angles. The special case represented by equation 5 is valid in the non paraxial domain as well. The argument associated with FIG. 1 that establishes the phase only nature of this correction plane does not make any paraxial assumptions.

It will be understood that holographic plate 5 of this invention is image specific. Where holographic plate 5 is moved from its plane in a projection system, either by translation along the projection axis, rotation, or translation within its own plane with respect to broadcast mask 2, degradation of the resultant image occurs.

It with therefore be understood that a projection system has been disclosed. It includes a broadcast mask having an image to be projected. The mask contains a desired working image to be projected to the workpiece. The broadcast mask and the desired working image are in alignment for proximity projection with the broadcast mask in position for broadcast of an image and the desired working image in position on the workpiece. A beam of coherent light interrogates the broadcast mask along a path of image projection to the workpiece.

The holographic plate is located at a common plane between the broadcast mask and workpiece for receiving light projected by the beam of coherent light to the holographic plate. This light naturally includes optical imperfections including for example diffraction. The holographic image reconstitutes the light to produce a sharp working image at the workpiece. This sharp working image has at least reduced optical imperfections including diffraction.

What is claimed is:

1. In a method of projection of an image from a broadcast mask to a workpiece, the process comprising the steps of:

providing a first broadcast mask having the image to be projected;

providing a second desired working image mask having an intended working image to be projected to the workpiece;

aligning the first broadcast mask and the second desired working image mask in alignment for projection with the first broadcast mask in position for broadcast of an image and the second desired working image mask in position of the intended working image on a workpiece;

providing a first and second temporally and spatially coherent beams for interrogating the first broadcast mask precisely along a path of image projection and the second desired working image mask opposite to incidence of light on a working image;

placing means for recording a holographic image at a common plane included in an optical path between the first broadcast mask and the second desired working image mask;

simultaneously scanning the first broadcast mask and the second desired working image mask to produce a phase only holographic image for correction at the means for recording a holographic image and recording the holographic image;

placing the recorded holographic image at the common plane; and, projecting an image utilizing coherent light from the first broadcast image mask through the holographic image to a workpiece to produce a corrected image at the workpiece.

2. In a method of projection of an image from a broadcast mask to a workpiece, the process of claim 1 comprising the steps of:

the provided a first and second temporally and spatially coherent beams are collimated.

3. In a method of projection of an image from a broadcast mask to a workpiece, the process of claim 1 comprising the steps of:

one of the provided first and second temporally and spatially coherent beams is divergent.

4. In a method of projection of an image from a broadcast mask to a workpiece, the process of claim 1 comprising the step of:

one of the provided first and second temporally and spatially coherent beams is convergent.

5. In a method of projection of an image from a broadcast mask to a workpiece, the process of claim 1 comprising the steps of:

providing a first and second temporally and spatially coherent beams intersecting the means for recording a holographic image at a common plane at an angle with respect to one another.

6. In a method of projection of an image from a broadcast mask to a workpiece, the process of claim 1 comprising the steps of:

providing a first projection optic between the first broadcast mask and the common plane;

providing a second projection optic between the common plane and the second desired working image mask; and, projecting an image utilizing coherent light from the first broadcast image mask through one projection optic, the holographic image, the second projection optic to the workpiece to produce a corrected image at the workpiece.

7. In a method of making a corrector plate for projection of an image from a broadcast mask to a workpiece, the process comprising the steps of:

providing a first broadcast mask having the image to be projected;

providing a second desired working image mask having an intended working image to be projected to the workpiece;

aligning the first broadcast mask and the second desired working image mask in alignment for projection with the first broadcast mask in position for broadcast of an image and the second desired working image mask in position of the intended working image on a workpiece;

providing a first and second temporally and spatially coherent beams for interrogating the first broadcast mask precisely along a path of image projection and the second desired working image mask opposite to incidence of light on a working image;

placing means for recording a holographic image at a common plane included in an optical path between the first broadcast mask and the second desired working image mask;

simultaneously scanning the first broadcast mask and the second desired working image mask to produce a phase only holographic image for correction at the means for recording a holographic image and recording the holographic image.

8. In a method of making a corrector plate for projection of an image from a broadcast mask to a workpiece, the process according to claim 7 comprising the steps of:

the provided a first and second temporally and spatially coherent beams are collimated.

9. In a method of making a corrector plate for projection of an image from a broadcast mask to a workpiece, the process according to claim 7 comprising the steps of:

one of the provided first and second temporally and spatially coherent beams is divergent.

10. In a method of making a corrector plate for projection of an image from a broadcast mask to a workpiece, the process according to claim 7 comprising the steps of:

one of the provided first and second temporally and spatially coherent beams is convergent.

11. In a method of making a corrector plate for projection of an image from a broadcast mask to a workpiece, the process according to claim 7 comprising the steps of:

providing a first and second temporally and spatially coherent beams intersecting the means for recording a holographic image at a common plane at an angle with respect to one another.

12. In a method of making a corrector plate for projection of an image from a broadcast mask to a workpiece, the process according to claim 7 comprising the steps of:

providing a first projection optic between the first broadcast mask and the common plane; providing a second projection optic between the common plane and the second desired working image mask.

13. In a method of making a corrector plate for projection of an image from a broadcast mask to a workpiece, the product of the process according to claim 7.

14. In a projection system including;

a broadcast mask having an image to be projected;

a desired working image to be projected to a workpiece;

the broadcast mask and the desired working image in alignment for projection with the broadcast mask in position for broadcast of an image and the desired working image in position on a workpiece;

a beam of coherent light for interrogating the broadcast mask along a path of image projection to the workpiece; the improvement of a holographic plate comprising:

a holographic plate located at a common plane between the broadcast mask and the workpiece for receiving the beam of coherent light to the holographic plate; and, a holographic image on the holographic plate for illumination by the beam of coherent light, the holographic image created by interfering temporarily and spatially coherent beams to the common plane from the broadcast mask and the desired working image to produce a phase hologram for reconstituting the coherent light to produce the desired working image at the workpiece having at least reduced optical imperfections including diffraction.

15. In a projection system according to claim 14 including:

the illumination by the beam of coherent light of the holographic plate includes converging light.

16. In a projection system according to claim 14 including:

the illumination by the beam of coherent light of the holographic plate includes angularly incident light on the holographic plate; and, light diffracted at the holographic image on the holographic plate for incidence to the workpiece includes primarily a first order of diffraction.

17. In a projection system according to claim 16 including:

a catcher plate over the workpiece, the catcher plate have a first transparent portion for allowing incidence of light to the workpiece and second opaque portions for prevent incidence of light to the workpiece.

18. In a projection system according to claim 14 including:

the beam of coherent light for interrogating the broadcast mask interrogates the broadcast mask at an angle other than normal to the broadcast mask.

19. In a projection system according to claim 14 including:

the holographic image at the holographic plate is phase only.

20. In a projection system including;

a broadcast mask having an image to be projected including openings and opaque portions;

a desired working image to be projected to a workpiece;

the broadcast mask and the desired working image in alignment for projection with the broadcast mask in position for broadcast of an image and the desired working image in position on the workpiece;

a beam coherent for interrogating the broadcast mask precisely along a path of image projection to the workpiece; the improvement of a holographic plate comprising:

a holographic plate having a holographic image at a common plane along a path between the broadcast mask and desired working image where:

W(y)=transmission amplitude of the broadcast mask;

E(x)=complex electric field at the holographic image after propagating from the broadcast mask to the holographic plate;

$$E(x) = A(x) \ast e^{i\phi(x)} = \int \frac{d^2y}{i\lambda z} e^{i\frac{k}{2z}(x-y)^2} W(y) \quad (1)$$

where:

x is a two dimensional vector position on the holographic image;

K is $2\pi/\lambda$;

A is the real amplitude (square root of the intensity) of the broadcast image plate; and, Z is the distance between the plane of the holographic image and the broadcast mask; and;

phase applied to the holographic image is:

$$\phi_p(X) = -2\ast\phi(x) \quad (2)$$

where:

$\phi$ is the phase at the holographic image; and, $\phi_p$ is the phase at the holographic image of plus one (+1) order.

21. In a projection system according to claim 20 including:

the beam of coherent light for interrogating the broadcast mask interrogates the broadcast mask at an angle other than normal to the broadcast mask;

the phase applied to the +1 order is;

$$\phi_p(x) = -2\ast\phi(x) + 2\ast\pi\ast x1/GP \quad (3)$$

where:

$\phi$ is the phase from equation (1);

$\phi_p$ is the phase in the plus one (+1) order;

x is a two dimensional vector giving plate position; and,

GP is the grating period.

22. In a projection system according to claim 21 including:

the beam diverges from the holographic plate;

z1=OPL (optical path length) between broadcast mask and phase surface on the holographic plate;

z2=OPL between the holographic plate and the workpiece; and, correction on holographic plate to requires only phase and no amplitude modulation of the incident wave;

z1 and z2 are related by:

$$z1 = M\ast z2 \quad (4)$$

where:

M=factor by which the image of mask 11 is expanded in size.

* * * * *